United States Patent [19]

Watkins et al.

[11] Patent Number: 4,684,904
[45] Date of Patent: Aug. 4, 1987

[54] LOW PHASE NOISE TWO PORT VOLTAGE CONTROLLED OSCILLATOR

[75] Inventors: Grant H. Watkins, Upper Marlboro; Lester K. Staley, Baltimore, both of Md.

[73] Assignee: The United States of America as represented by the Secretary of the Air Force, Washington, D.C.

[21] Appl. No.: 816,596

[22] Filed: Jan. 6, 1986

[51] Int. Cl.$^4$ .............................................. H03B 5/12
[52] U.S. Cl. ............................ 331/117 R; 331/177 V
[58] Field of Search ........ 331/117 R, 117 FE, 177 R, 331/177 V

[56] References Cited

U.S. PATENT DOCUMENTS 4,075,580 2/1978 Sunkler ................................. 331/96
4,246,550 1/1981 Cohen .......................... 331/107 DP
4,310,809 1/1982 Buck et al. ..................... 331/117 D
4,450,416 5/1984 Mears ........................... 331/117 FE
4,481,487 11/1984 Brehm et al. ................... 331/117 D
4,484,157 11/1984 Helle et al. ..................... 331/116 R
4,574,256 3/1986 Singh ............................. 331/177 V Primary Examiner—Eugene R. LaRoche
Assistant Examiner—David Mis
Attorney, Agent, or Firm—William Stepanishen; Donald J. Singer

[57] ABSTRACT

A low noise two port voltage controlled oscillator having a coarse tuning circuit serially connected to an inductor to form a resonant circuit. A fine tuning circuit is serially connected between the resonant circuit and the input to the amplifier. A large capacitance series silicon varactor minimizes noise at the frequency of operation while optimizing the coarse tuning range.

9 Claims, 12 Drawing Figures $$Q = \frac{\omega(L+L_{B'B})}{r_C+r_L+r_{BB}} \qquad \text{NEGATIVE RESISTANCE} = \frac{g_m}{(\omega C_{CE})(\omega C_{B'E})}$$

$$f_{oscillation} = \frac{1}{2\pi}\sqrt{\left(\frac{1}{L+L_{B'B}}\right)\left(\frac{1}{C_V}+\frac{1}{C_{CE}}+\frac{1}{C_{B'E}}\right)}$$

LOW PHASE NOISE TWO PORT VOLTAGE CONTROLLED OSCILLATOR

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a voltage controlled oscillator apparatus, and in particular to a low phase noise two port voltage controlled oscillator apparatus.

The state of the art of voltage controlled oscillators is well represented and alleviated to some degree by the prior art apparatus and approaches which are contained in the following U.S. Patents:

U.S. Pat. No. 4,075,580 issued to Sunkler on Feb. 21, 1978;

U.S. Pat. No. 4,246,550 issued to Cohen on Jan. 20, 1981;

U.S. Pat. No. 4,310,809 issued to Buck et al on Jan. 12, 1982;

U.S. Pat. No. 4,450,416 issued to Mears on May 22, 1984;

U.S. Pat. No. 4,481,487 issued to Brehm et al on Nov. 6, 1984;

U.S. Pat. No. 4,484,157 issued to Helle et al on Nov. 20, 1984

Buck et al disclose a low noise voltage controlled oscillator which is based on a grounded collector junction transistor which includes both a coarse tuning voltage port and a fine tuning voltage port which are coupled respectively to the base terminal. The coarse tuning and the fine tuning circuits both utilize tuning varactors. Helle et al illustrates the operation of a wide frequency range voltage controlled oscillator in which the output is taken from the emitter of a junction transistor. In Mears the output is taken from the source of a FET. The Brehm et al discusses the use of wide tuning range varactors. The Cohen utilizes the wide tuning range features of lumped circuits to provide a wideband, millimeter wave frequency Gunn oscillator apparatus. The Sunkler utilizes the series connection of a voltage variable capacitor and a line element to provide a wide band junction transistor oscillator. However, the problems of phase noise generation by high Q varactors, such as gallium arsenide varactors is not addressed. Wherein the present apparatus utilizes large silicon varactors to suppress phase noise generation in a wide band voltage controlled junction transistor oscillator.

It is common in modern broadcast stations, to use crystals to maintain the frequency accurately to 2 or 3 cycles. Where a continuously adjustable frequency output is needed, some type of self-controlled oscillator is needed. The Hartley oscillator is well known in the art and until very recently extensively utilized, since it is one of the simplest. Its operation depends upon the energy which is fed back from the plate to the grid circuit through the inductive coupling of the two sections of the coil. The frequency is determined by the inductance and capacitance values in the tuned circuit.

The Colpitts oscillator which is also very well known is similar circuit. It differs from the Hartley circuit only in the manner in which energy is fed back from the plate circuit to the grid circuit, the coupling being accomplished by a capacitive voltage divider rather than a tapped coil.

The Colpitts oscillator is still in use today and has been updated to use the current semiconductor technology. In generation, a parallel combination of two capacitors and an inductor form a variable inductor which series resonates with a third capacitive reactance to form a conventional transistor Colpitts oscillator in which the transistor intrinsic capacitances—$C_{BE}$ & $C_{CE}$—are used to generate the negative resistance. However, this circuit has been found to be incapable of achieving the desired noise performance over a 15% band as is frequently required.

Another prior art technique provides a voltage controlled oscillator in which fine tuning and coarse tuning are achieved by tuning a single varactor, or back to back varactors, through the summation of coarse tune voltage and fine tune voltage for special video circuits. The noise performance was found to be relatively good, but did not meet the requirement of 150 db/Hz at 1 Mhz. The tuning port modulation bandwidth of this type of circuit considerably less than 50 Mhz.

SUMMARY OF THE INVENTION

The present invention utilizes to a low noise, high frequency oscillator whose frequency may be controlled over a relatively wide frequency band using voltage variable capacitors (varactor diodes). Silicon varactors generate less noise than gallium arsenide varactors, in spite of the fact that the gallium arsenide varactors have much higher Qs. Large capacitance silicon varactors are capable of handling larger RF peak currents than smaller capacitance silicon varactors. Therefore, the large capacitance silicon varactors generate less noise than the small ones. The varactor noise is a function of the RF voltage across it; and such noise tends to be independent of the bias voltage on the varactor as long as the varactor is completely reverse biased over the full RF period. These low noise silicon varactors are utilized with a junction transistor which has good noise performance at a low bias level. The fine tune and coarse tune varactors are located on opposite sides of a resonator inductor to achieve the required tuning port isolation. The resonator inductance and tuning capacitance are selected to minimize peak RF voltage on the varactor while maximizing Q and tuning range. The fine tuning varactor is placed in series with the voltage controlled oscillator resonator.

It is one object of the present invention, therefore, to provide an improved voltage controlled oscillator apparatus.

It is another object of the invention to provide an improved voltage controlled oscillator apparatus which will tune a 15% bandwidth at L Band over a coarse tune voltage range of 0 to −20 volts.

It is another object of the invention to provide an improved voltage controlled oscillator which will maintain a fine tune port sensitivity of 2 Mhz/volt +12% over the 15% band.

It is another object of the invention to provide an improved voltage controlled oscillator which will draw no current from either tuning port.

It is another object of the invention to provide an improved voltage controlled oscillator which will maintain an FM carrier to noise ratio over the 15% band of: −150 db/Hz at 1 Mhz from carrier; and −130 db/Hz at 100 Khz from carrier.

It is another object of the invention to provide an improved voltage controlled oscillator which will maintain 50 Mhz bandwidths at both tuning ports.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
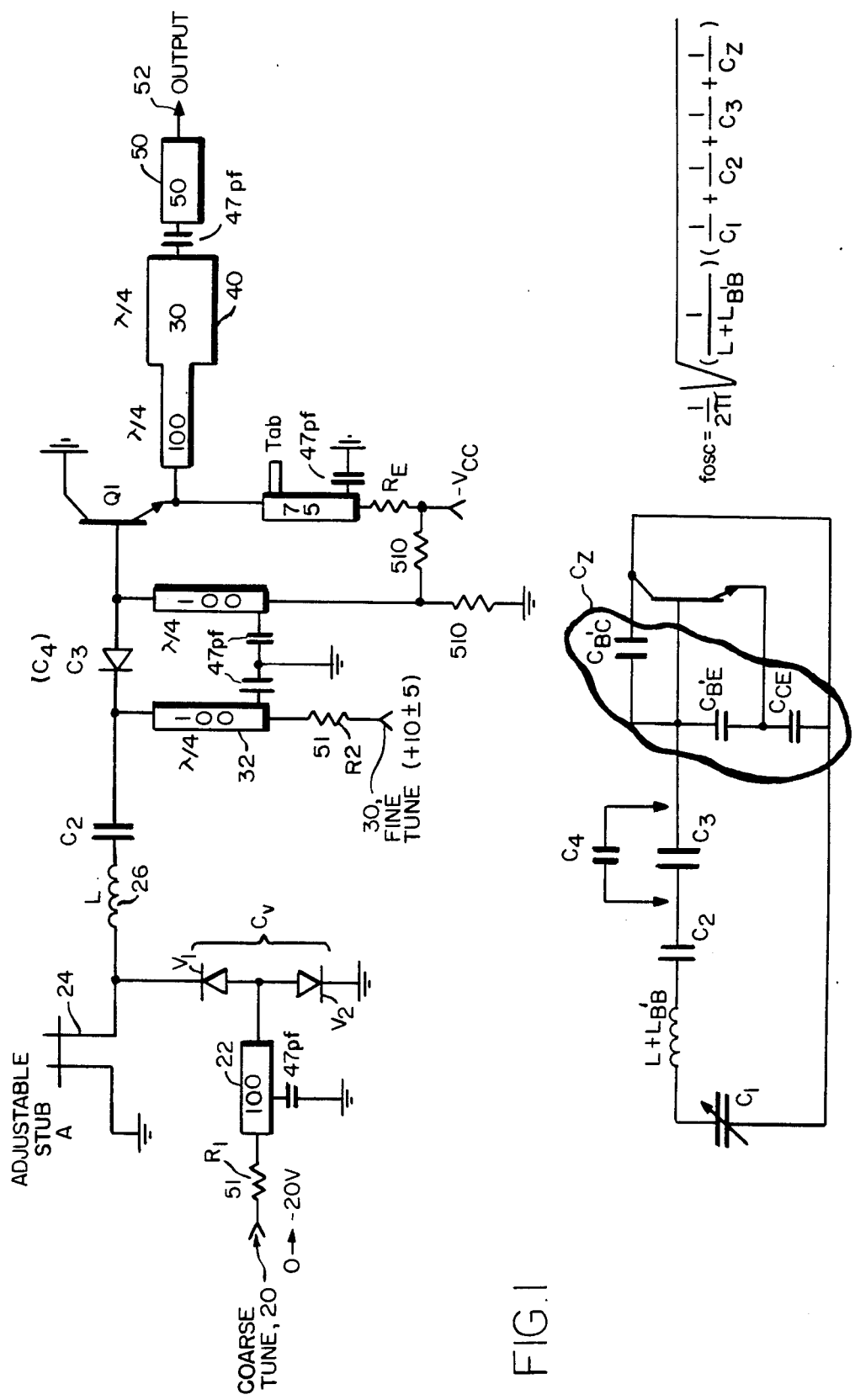
FIG. 1 is the schematic diagram and equivalent circuit of the two port voltage controlled oscillator (VCO) apparatus according to the present invention.

In general, it has been found that:

1. Silicon varactors generator less 1/f noise than gallium arsenide varactors, in spite of the fact that GaAs varactors have much higher Q's;

2. Large capacitance silicon varactors are capable of handling larger RF peak currents than smaller capacitance silicon varactors. Hence, the larger capacitance silicon varactors tend to generate less 1/f noise than the small capacitance silicon varactors, in spite of the fact that the smaller capacitance varactors have a higher Q; and 3. Varactor noise is a function of the RF voltage across it; and such noise tends to be independent of the bias voltage on the varactor as long as the varactor is completely reverse biased over the full RF period;

Referring now to FIG. 1, there is shown a schematic diagram of the low phase noise two port voltage controlled oscillator apparatus. The frequency of operation of the voltage controlled oscillator apparatus is determined by the component values and settings of the coarse and fine tune circuits respectively. The coarse tune circuit comprises an input port 20 which receives an input DC voltage in the range of zero to −20 volts. The input port 20 is connected to a resistor $R_1$ which is in series with a 100Ω transmission line 22. A 47 pf capacitor is connected between the junction of the resistor $R_1$ and the transmission line 22 and ground. The other end of the transmission line 22 is connected to the junction of two back to back varactors $V_1$, $V_2$ which provide the coarse tune varactor capacitance, $C_V$. The cathode of varactor $V_2$ is connected to ground. The cathode of varactor $V_1$ is connected to the junction of adjustable stub 24 and the series combination of inductor 26 and capacitor $C_2$.

The fine tune circuit comprises an input port 30 which is connected in series to the series combination of resistor $R_2$ and transmission line 32. The other end of the transmission line 32 is connected to the junction of capacitor $C_2$ and varactor $C_3$. A fine tune voltage signal which comprises +10 volts DC +5 volts, is applied to input port 30 to adjust the fine tune value of varactor $C_3$. The biasing circuit for transistor $Q_1$ is connected between the base and emitter of transistor $Q_1$ to their respective reference sources ($-V_{CC}$ and ground). The output of the voltage controlled oscillation is taken from the emitter of the transistor Q1. The output signal is applied through a 100Ω to 30Ω transmission line impedance transformer 40 to a 50Ω transmission line 50 which is connected to the output terminal 52.

The low phase noise two port voltage controlled oscillator apparatus utilizes the particular components, features and principles which are listed as follows.

The voltage controlled oscillator is comprised of the following:

1. Selection of transistor with low base spreading resistance, so total resonator Q is optimized.

2. Selection of transistor with good noise performance at low bias levels, so varactor diodes can handle peak RF levels: 20 Ma to 40 Ma DC.

3. Select small capacitance value for DC blocking capacitor $C_2$ so that resonator Q is high and so most of the resonator RF voltage appears across it, and not across the tuning varactors.

4. Use large capacitance tuning varactors because they are less noisy: they can handle peak RF currents better, and less peak $R_f$ resonator voltage appears across them.

5. Achieve fine tuning with a large capacitance series varactor to minimize noise and optimize coarse tune range.

6. Use an inductor or series short circuited stub to realize the resonator inductance. Transmission lines, even loseless lines, reduce the resonator Q.

7. Locate the fine tune coarse tune varactors on opposite sides of the resonator inductor to achieve the required tuning port isolation.

8. To increase tuning range of coarse tune varactors, drastically shorten varactor DC return—stub A of FIG. 1—so the length is much less than a quarter wavelength.

9. To increase tuning range of coarse tune varactors, utilize reverse bias region of −4 volts to −2 volts on varactors where capacitance changes the most. Such regions is not normally used, but it is usable because the varactor RF voltage has been minimized.

10. Load oscillator very lightly so that Q of resonator is not lowered.

The two port, low phase noise voltage controlled oscillator apparatus achieved the performance criteria which was listed under the Objects of the Invention by incorporating the following elements and features:

1. Selection of a low $r_{B'B}$ transistor with good noise performance at low bias level.

2. Selection of a resonator inductance and a tuning capacitance to minimize the peak RF voltage on the varactors while maximizing Q and the tuning range.

3. Utilization of the lower noise generation characteristics of large silicon varactor diodes.

4. Achieve the fine tuning characteristics with a varactor in series with voltage controlled oscillator resonator.

Figure 2A:
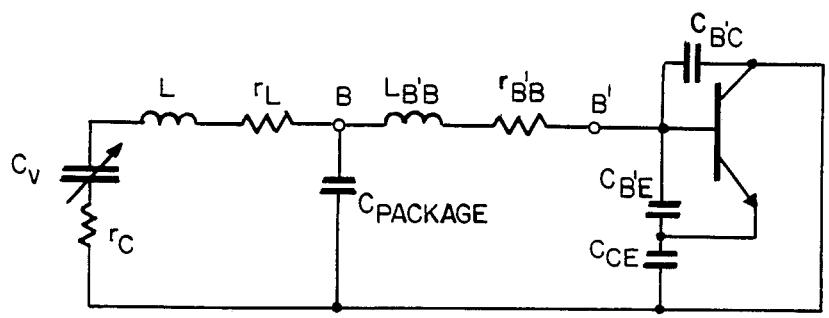
FIG. 2a is a simplified schematic diagram of the VCO apparatus.
Figure 2B:
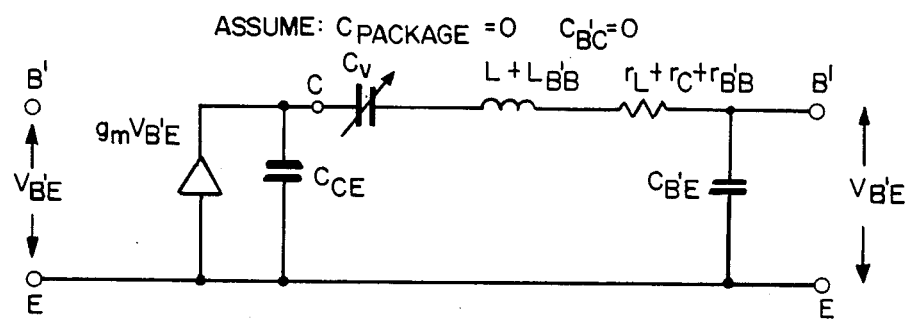
FIG. 2b is an equivalent circuit of the apparatus of FIG. 2a, FIG. 3 is a schematic diagram of a test VCO apparatus using a manual tuning capacitor.

Oscillator noise theory is given by Edson's noise formula for oscillator FM noise which is the following:

$$N/C = \tfrac{1}{2}(MkTB/P_o)(f_o/f_m Q)^2$$

wherein:
 N = Noise power
 C = Carrier power
 B = Bandwidth
 T = Temperature
 Po = Oscillator output power
 M = Noise measure of the transistor
 fm = Frequency from carrier
 fo = carrier frequency
 k = Boltzmann's constant The terms "M" and "Po" are determined by the selection of an optimum oscillate transistor, and by the way the transistor is biased and loaded. In order to achieve optimum N/C, Q is the predominant factor. In FIGS. 2a and 2b there is shown respectively the schematic and equivalent circuit diagrams for basic Colpitts oscillator with an external resonator connected. The transistor base inductance is $L_{B'B}$; the base spreading resistance is $r_{B'B}$ and the base package capacitance is Cpackage. Losses associated with resonator inductor L are accounted for by $r_L$; losses associated with resonator capacitor $C_v$ are accounted for by $r_c$. In order for the circuit to oscillate, the components from collector to base must be slightly inductive inductive to resonate with $C_{BE} C_{CE}/(C_{BE}+C_{CE})$. In order to achieve the maximum tunability with the tuning capacitor $C_v$, Cpackage should be minimized, and $C_{CB}$; $C_{BE}$ and $C_{CE}$ should be maximized. The total resonator Q for the circuit is given by the following equation:

$$Q = \frac{W(L + L_{B'B})}{r_C + r_L + r_{B'B}};$$

wherein in order to maximize Q, the quantities $r_L$, $r_C$ and $r_{B'B}$ should be minimized. The quantities $r_C$ and $r_L$ are related to the Q's of the resonator elements L and Cv.

Transistors with high $C_{B'E}$ and high $f_T$ must have low $r_{B'B}$; since ($Y_2$ $r_{B'B}$ $C_{B'E}$) must be much less than $f_T$. Hence, those transistors designed for higher power levels rather than for low noise figure will generally have lower $r_{B'B}$. In this circuit the frequency of oscillation, $f_o$ is given by the following equation:

$$f_o = \tfrac{1}{2}\left(\frac{1}{L + L_{B'B}}\right)\left(\frac{1}{C_v} + \frac{1}{C_{CE}} + \frac{1}{C_{B'E}}\right)$$

When a microwave oscillator is varactor tuned, the noise that is generated in the varactor tuning diodes becomes a very significant factor in determining the total noise performance. This factor is not accounted for in Edson's noise formula.

Figure 3:
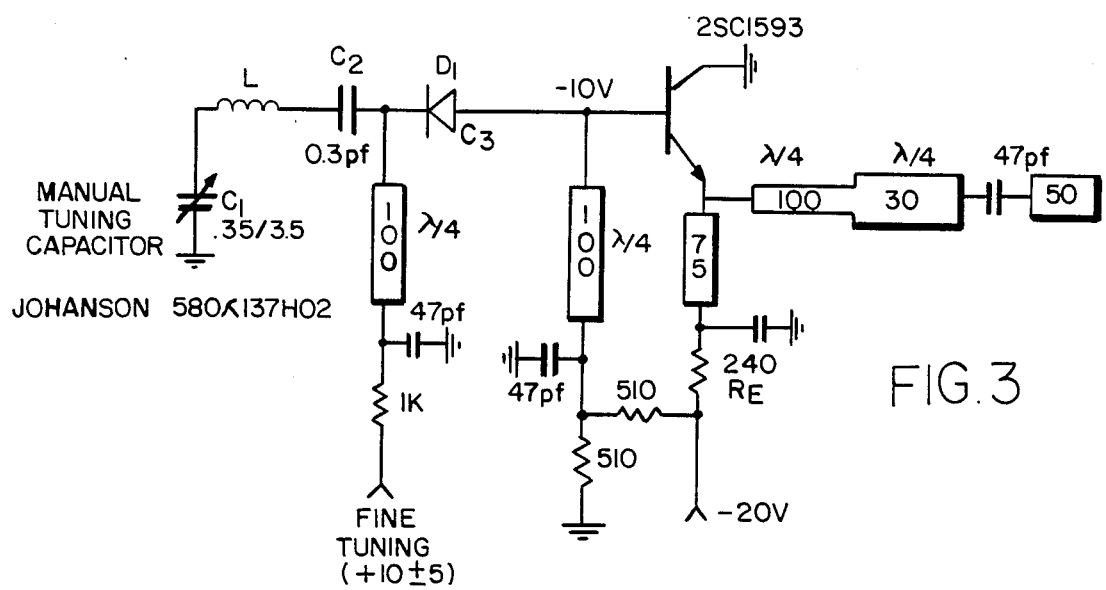

Turning now to FIG. 3, there is shown a schematic diagram for a test circuit which was used to evaluate the noise performance of varactor tuning diodes. It will be noted that this test circuit is essentially the same as the circuit in FIG. 1 with the minor exception that the coarse tuning circuit of FIG. 1 has been replaced by a manual tuning capacitor $C_1$. In the present circuit the varactor diode $D_1$ provides the fine tuning capacitance $C_3$ as was in FIG. 1. With the fine tune varactor, $D_1$ shorted, the oscillator was capable of −157/−160 db/Hz at 1 Mhz across a 25% tuning range of capacitor $C_1$. When using a GC1707-35 varactor for diode $D_1$, and with its capacitance, $C_3$ set to 1.7 pf by applying a bias of +20 volts across it, the noise degraded to 155/−158 db/Hz at 1 Mhz across the tuning range of capacitor $C_1$. A GC1704-35 varactor was utilized for diode, $D_1$ and its capacitance $C_3$ was set to 0.8 pf by applying a bias of +20 volts across it, the noise degraded to −153/−156 db/Hz at 1 Mhz across the tuning range of capacitor, $C_1$. Clearly, the larger capacitance diode, with its lower Q, produced better noise performance. By using a GC1710-35 varactor for diode, $D_1$, a capacitance value of 2.8 pf could be obtained at a bias setting of +20 volts.

Figure 4:
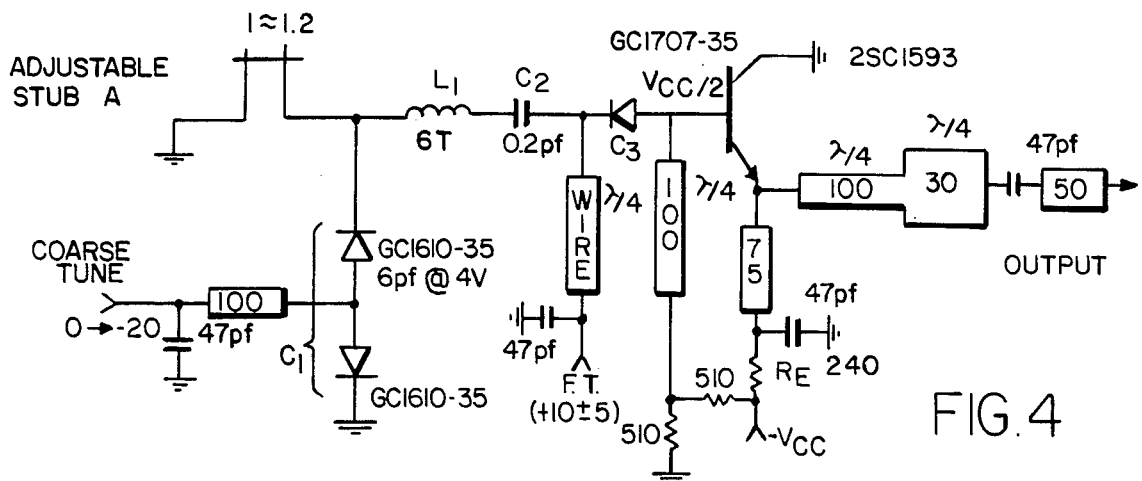
FIG. 4 is a schematic diagram of a test VCO apparatus using back to back varactors, FIGS. 5a, b and c are a schematic diagram and the graphical representations, respectively, of a noise performance test.

Referring now to FIG. 4, there is shown a schematic diagram wherein the circuit of FIG. 3 was modified by changing capacitor, $C_2$ to 0.2 pf, leaving varactor diode $D_1$ at GC1707-35, and replacing the manual tuning capacitor $C_1$ with a biased silicon varactor diode configuration as shown in FIG. 1 for the coarse tuning circuit. The test circuit of FIG. 4 is used to further evaluate circuit noise performance in spite of the fact that the largest capacitance varactor had the lowest Q. It was noted that the noise performance across the total varactor voltage range of −1 volt to −25 volt was most constant for the largest capacitance varactor.

Figure 5A:
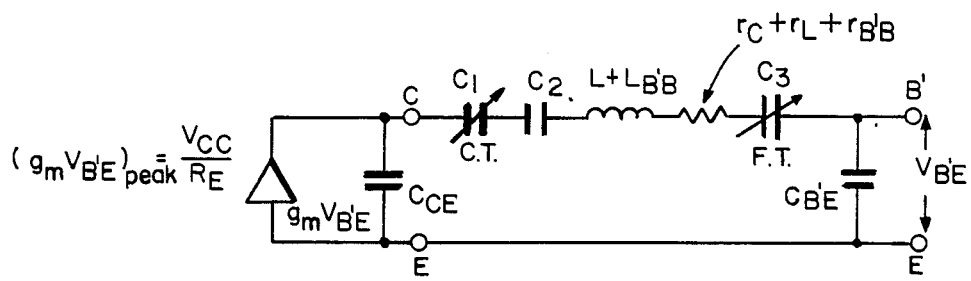

Similar test results were obtained when back to back varactors were used for tuning capacitor, $C_1$ of FIG. 5a. In FIG. 4, there is shown two GC1610-35 back to back varactors which provide capacitance, $C_1$ and a GC1707-35 varactor for diode $D_1$, all three elements which are in series, produced noise performance from −151 to −156 db/Hz across the tuning range of −1.5 volt to −25 volts. For a GC1610-35 varactor the capacitance values are as follows: 11 pf at 1 volt, 7 pf at 10 volts and 2.9 pf at 20 volts. The measured test results are shown in Table 1.

TABLE 1

| Coarse Tune | Port | DF(+10 ± 5) | 1 MC | 100 Kc |
|---|---|---|---|---|
| −1.5 | +11 | +3, −2.5 | 156 | 133 |
| −3.0 | +11 | +4, −5 | 151 | 128/9 |
| −5 | +11 | +4, −4 | 153/4 | 130/1 |
| −7.5 | +11 | +3.8, −4 | 153/4 | 131 |
| −10 | +12 | +4, −4 | 153 | 131/2 |
| −15 | +11 | +3.5, −4 | 153 | 131 |
| −20 | +9 | +3.8, −3.8 | 152 | 131 |
| −22.5 | +8 | +3.7, −3.7 | 152/3 | 130 |
| −25 | +7 | +3.8, −3.8 | | |
| −2 | +11 | +3, −4 | 153/4 | 132 |

Figure 5B:
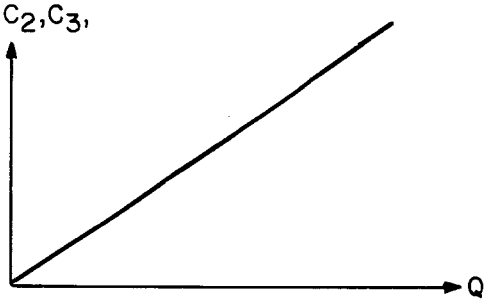
Figure 5C:
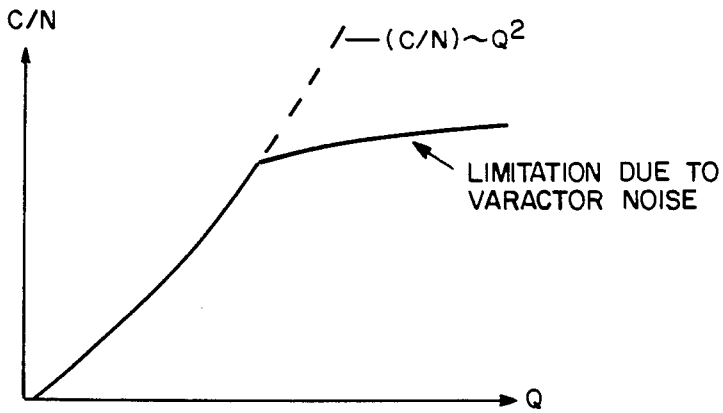

In FIG. 5a there is shown the equivalent circuit of FIG. 4 wherein capacitance $C_{B'C}=0$. From inspection, it is clear that as tuning varactor capacitance, $C_1$ is made larger, the RF voltage across it decreases. When varactor capacitance, $C_1$ is split into two equal series varactors, the RF voltage across each varactor is halved. As more varactors are put in series, less voltage appears across each one. Since most of the resonator loss is determined by the resistance of the varactors, $r_C$ and by the transistor base spreading resistance, $r_{B'B}$ the resonator Q can be increased by increasing the value of the inductor, L. As the inductor, L is increased, the voltage across it and across each series capacitor increases. As the voltage across each varactor increases, the noise generated in each varactor increases, and a point is reached where increasing Q does not improve noise performance. These characteristics are shown in FIGS. 5b and 5c. There is therefore a trade off between voltage controlled oscillator noise performance and tuning bandwidth.

In an effort to further evaluate the noise performance of varactors, another voltage controlled oscillator was constructed using just one silicon varactor for coarse tuning. The schematic diagram was identical to FIG. 4 except for the following changes: $C_2=0.3$ pf, NEC33355 transistor, no stub A. The 2SC1593 and NEC33355 transistors have similar noise performance at 1 Mhz, but the NEC33355 is slightly better at 100 Khz. Similar results were obtained, wherein large capacitance varactors produced better noise performance. This was particularly evident with measurements made at 100 Khz.

Figure 6:
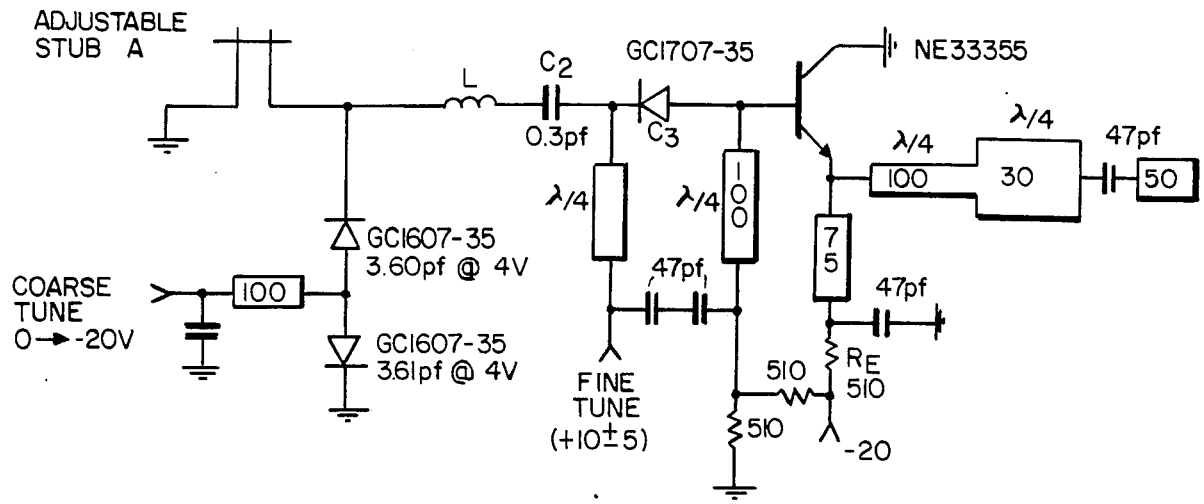
FIG. 6 is a schematic diagram of a test VCO using various combinations of varactors.

This voltage controlled oscillator was then converted to one using back to back GC1607-35 varactors for the coarse tuning. The schematic diagram is shown in FIG. 6 and the tuning and noise performance results are shown in Table 2.

TABLE 2

| Coarse Tune | Port | DF(+10 ± 5) | 1 MC | 100 Kc |
|---|---|---|---|---|
| −1.5 | +12 | +5.5, −5.5(1.1) | 152 | 130/1 |
| −3 | +13 | +5, −7(1.2) | 151 | 129/30 |
| −5 | +13 | +5.5, −6(1.15) | 152 | 129/30 |
| −7.5 | +11 | +5, −6(1.1) | 153 | 131 |
| −10 | +11 | +5, −6(1.1) | 153 | 131 |
| −15 | +10 | +5, −6(1.1) | 155 | 132 |
| −20 | +8 | +5, −5(1.0) | 155 | 132 |
| −22.5 | +7 | +5, −5.5(1.05) | 155 | 132 |
| −25 | +6 | +5, −6(1.1) | 153 | 131 |

A piece of loseless transmission line less than a quarter wavelength long is capable of generating inductive reactance. However, if such a line is terminated by an impedance whose real part is finite, the resulting output impedance at the output of the line will have a real part which is much greater than the real part of the input termination hence, a transmission line is not a suitable resonator for a high Q varactor tuned voltage controlled oscillator.

An inductor or a series short circuited stub are acceptable elements for a high Q resonator, because they move along the Smith Chart on contours of constant real impedance. Series short circuited stubs are difficult to realize in practice, and so an inductor is a reasonable choice at L Band.

It has been found in practice that the inductor must be wide spaced and wound with a small diameter to minimize stray capacitance, so the widest tuning range can be achieved. Stray capacitance to ground is minimized by mounting the coil above the printed circuitry. The inductor must be connected with very short leads; long leads become transmission lines which lower the resonator Q and ruin the voltage controlled oscillator noise performance.

The fine tuning circuitry in the present low noise voltage controlled oscillator apparatus is designed in such a way that optimum noise performance can be achieved with relatively constant fine tuning sensitivity across the band, as shown in FIG. 4 and FIG. 6. A large capacitance silicon varactor in series with the coarse tune varactors is used, so that minimal RF voltage appears across it. Hence optimum noise performance is achieved.

FIG. 1 is a schematic diagram of the equivalent circuit of the low noise two port voltage controlled oscillator apparatus which depicts a simplified version of the fine tune circuitry. The transistor intrinsic capacitances, $C_{BE}$, $C_{CE}$ and $C_{BC}$ are lumped together as $C_z$. The inductor $(L+L_{B'B})$ includes the inductance of the resonator, the transistor input inductance, and the stray inductances. The capacitor $C_2$ is a DC blocking capacitor and tank resonating capacitor. The capacitor $C_4$ is a dynamic incremental capacitance which is generated when the fine tune port is tuned away from its quiescent position. The capacitor $C_3$ represents the fine tune varactor capacitance at the quiescent position. The capacitor $C_3$ includes the static value of $C_4$. The boundary conditions for $C_3$ are as follows: $C_3>C_2 C_1max/(C_2+C_1max)$, $C_4<C_3$.

The fine tuning is achieved by capacitor $C_4$. The capacitor $C_4$ affects the frequency most when the combination $LC_1$ is maximum and the oscillator frequency is minimum: the capacitive reactance of $C_2$ is maximum when the oscillator frequency is minimum, and hence the frequency change is maximum when incremental capacitor $C_4$ is introduced.

The performance of the fine tune circuit has been analyzed by a computer program written for the HP9835: "TWEEK". To achieve the relatively constant fine tune sensitivity over the 15% tuning band, good isolation between coarse tune varactor $C_1$ and fine tune varactor $C_3/C_4$ must be achieved. For this reason, the fine tune and coarse tune varactors are located on opposite sides of inductor L. A significant improvement in the variation of fine tune sensitivity over the band can be accomplished with the utilization of a separate "tweeker" circuit.

Figure 7:
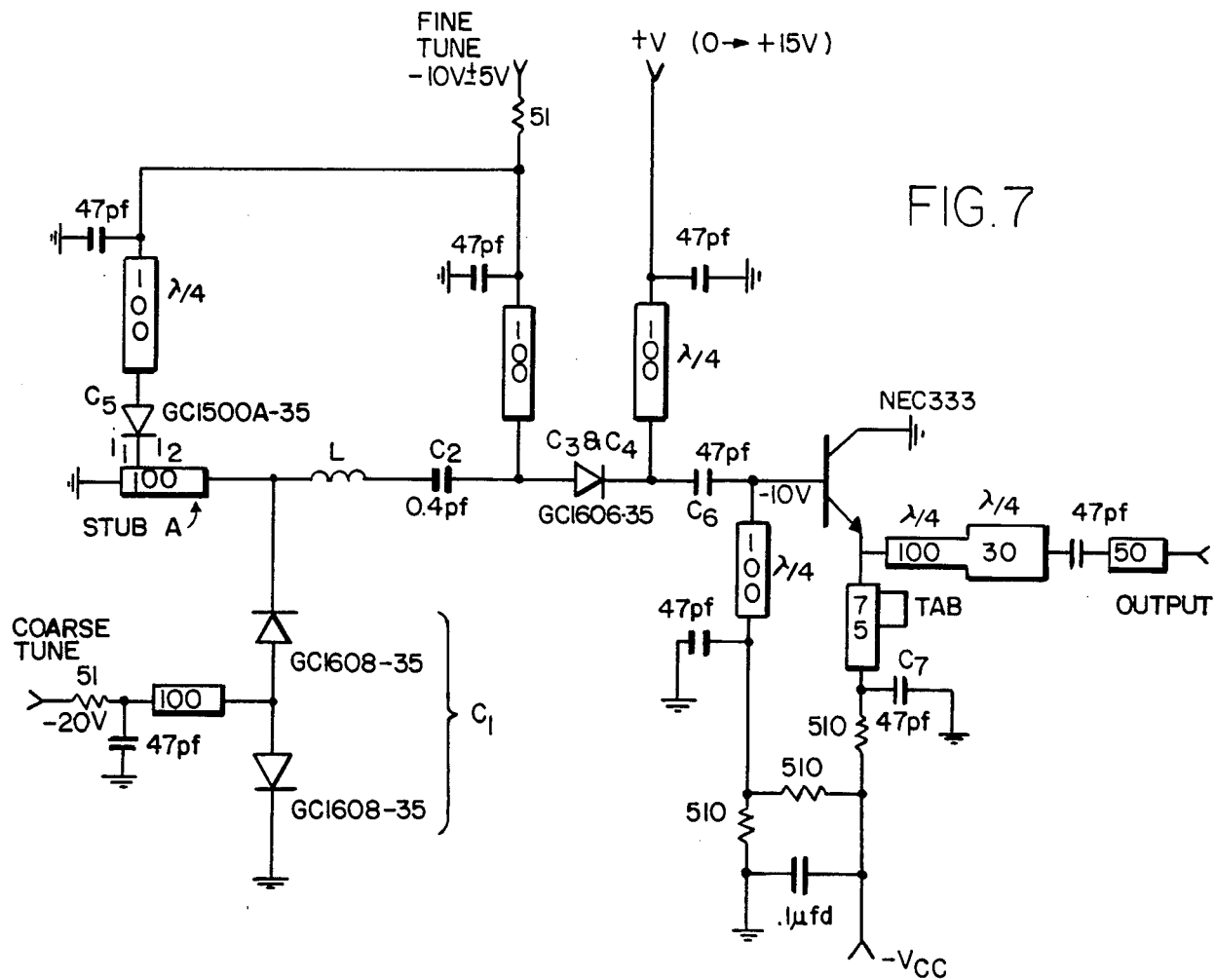
FIG. 7 is a schematic diagram of the VCO apparatus with a tweeker circuit, and, FIGS. 8 and 9 are graphical representations, respectively, of the varactor capacitance, $C_V$ versus resonator inductance, L.

In FIG. 7, there is shown an additional embodiment of the voltage controlled oscillator apparatus wherein a tweeker circuit has been included in the coarse tuning circuit of FIG. 1.

Most of the fine tuning is done by capacitor $C_4$. $C_4$ pulls the frequency most when $C_1$ is maximum and the oscillator frequency is minimum: the capacitive reactance of $C_2$ is maximum when the oscillator frequency is minimum, and hence the frequency change is maximum when incremental capacitor $C_4$ is introduced.

Incremental capacitor $C_5$ pulls the oscillator frequency most when the value of capacitor $C_1$ is minimum, and when the oscillator frequency is maximum. The effects of fine tune capacitors $C_5$ and $C_4$ have opposite slopes when fine tune incremental frequency change versus oscillator frequency is plotted. These opposite slopes are adjusted so that a nearly constant fine tune sensitivity is achieved over the entire tuning band. The value of capacitor $C_5$ is very small, i.e. a small fraction of a picofared. Obtaining such a small value of dynamic capacitance for $C_5$ is achieved by connecting a very small capacitance varactor near the ground end of the DC return for coarse tune varactor $C_1$, as shown in FIG. 7. The location of the connection point from ground determines the effective value of $C_5$.

The performance of the oscillator circuit of FIG. 7 is determined by the program "TWEET" which is shown in Table 5. The fixed values for capacitors $C_1$, $C_2$, $C_z$, $C_3$, and inductor L are chosen arbitrarily, but with care. As coarse tuning capacitor $C_1$ is changed in fixed steps, the oscillator frequency $F_1$ with $C_5=C_4=0$ is calculated: then the oscillation frequency $F_2$ with fixed values for incremental fine tune capacitors $C_5$ and $C_4$ is calculated. The fine tune sensitivity is $D=F_2-F_1$ for each value of $C_1$.

Examination of the design examples indicates that very small incremental values for "Tweeker Capacitor" $C_5$ are required, in the order of 0.0001 pf to 0.0004 pf. A Frequency Sources GC1500A-35 varactor has a static capacitance of 0.32 pf at 10 volt bias, of which 0.15 pf is package capacitance. At 20 volt bias, the total capacitance is 0.26 pf. This results in an approximate incremental capacitance of (0.32-0.26) pf/10 volts=0.006 pf/volt. Furthermore, as shown in FIG. 7, both the static and dynamic values of $C_5$ are reduced by the location of the point at which $C_5$ is connected on the coarse tune varactor DC return—Stub A. If $l_1=0.01\lambda$, and $l_2=0.14\lambda$, the value of $C_5$ has been reduced by a factor exceeding 15.

Examination of the design examples also indicates that the ratio of $C_5/C_4$ is important for obtaining maximally flat fine tune sensitivity. The ratio $C_5/C_4$ can be "Fine Tuned" by adjusting DC voltage VA of FIG. 7 for minimal voltage controlled oscillator fine tune sensitivity variation across the coarse tune range. This adjustment takes place after Stub A has been adjusted. This circuit allows good fine tune performance over an octave coarse tuning range.

A complete schematic diagram of a 16% bandwidth voltage controlled oscillator is shown in FIG. 7. The emitter tab and position of capacitor $C_7$ are adjusted for oscillation over the band. The output is taken through series 30 ohm and 100 ohm quarter wave lines so the oscillator resonator is very lightly loaded. Base bias is provided by a quarter wave 100 ohm line. Voltage $V_A$ is used to adjust the fine tuning sensitivity. $V_A$ and capacitor $C_6$ may be eliminated, with capacitors $C_3$ and $C_4$ connected directly to the transistor's base, if the fine tune port is allowed to be at a positive quiescent value. The fine tune 100 ohm line to varactor $C_3/C_4$ is slightly less than $\lambda/4$ at midband. The fine tune 100 ohm line to "Tweeker" varactor $C_5$ is $\lambda/4$ at midband. The coarse tune bias line and the DC varactor return lines are less than $\lambda/4$ at the highest frequency to prevent in band spurious tuning responses.

The fine tune bias lines must be isolated from the coarse tune lines; the fine tune varactor must be isolated from the coarse tune varactors. The fine tune function will not operate properly if there is any significant amount of coupling between the coarse tune and fune tune varactors. Capacitors $C_2$, $C_3$ and $C_6$ are stacked perpendicular to the etched microstrip line to reduce stray capacitance to ground. The coarse tune varactors are stacked on top of each other to reduce stray capacitance to ground. Resonator inductor L is mounted above the microstrip circuitry to reduce stray capacitance to ground. The base bias line, the fine tune port line, and the fine tune varactor bias line to voltage $V_A$ are stripline.

Using the circuit shown in FIG. 7, with $V_A=0$, a fine tune sensitivity of 2.38 Mhz/Volt±0.8% was measured over a 13.2 bandwidth. The value printed on capacitor $C_2$ was 0.3 pf, but it was measured to be closer to 0.4 pf.

As previously stated above, in order to get good noise performance, it is necessary to use large capacitance tuning varactors. However, in order to obtain the high Q resonator necessary to achieve good noise performance, varactors with small capacitances are required. This problem is resolved as follows. The use of back to back varactors for the coarse tune capacitor allows larger capacitance varactors to be used for a given capacitance range, and the total RF voltage across each varactor is halved. Furthermore, the ratio of $C_{max}/C_{min}$ increases as the capacitance value increases for silicon abrupt varactors.

The use of a small capacitance DC blocking capacitor serves two RF functions. By allowing most of the resonator RF voltage to appear across the fixed capacitance, the varactor can be used at lower bias voltages than are normally used: $-4$ volts to $-2$ volts. It is in this region where the varactor capacitance changes the most. The second function is that the small fixed capacitance in series with the large varactor produces an effective small capacitance varactor.

Figure 8:
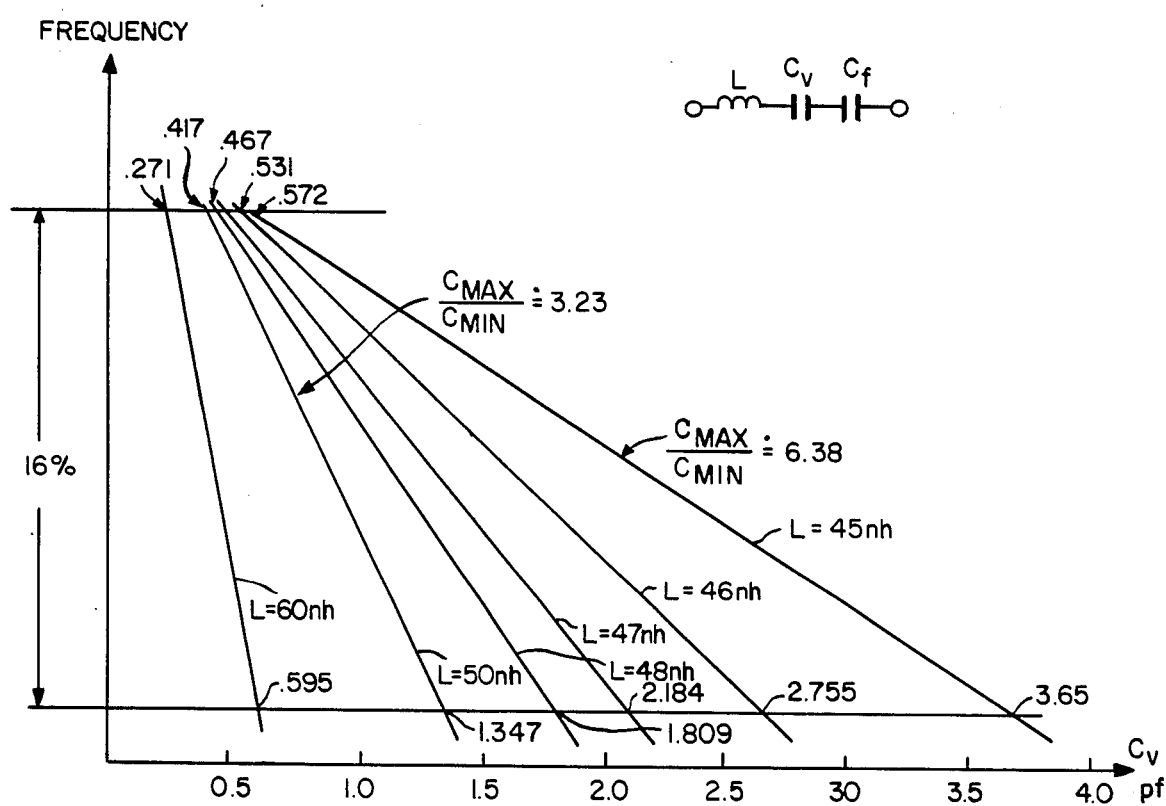

FIG. 8 shows how high Q circuits tune faster than low Q circuits. To tune a given frequency band, and for a constant small value of fixed capacitance $C_f$, plots of varactor capacitance $C_v$ versus resonator inductance L are shown: for L=45 nh, $C_{vmax}/C_{vmin}=6.4$; for L=50 nh, $C_{Vmax}/C_{Vmin}=3.2$; for L=60 nh, $C_{vmax}/C_{vmin}=2.2$. High Q circuits don't need as much change in varactor capacitance to tune a given band. A computer program written for the HP9835 for making such calculations is shown in Table 3.

TABLE 3

| | |
|---|---|
| 10 | REM PROGRAM "RESFREQ" |
| 20 | REM ALL CAPACITORS ARE IN SERIES WITH L |
| 30 | REM COARSE TUNE CAPACITOR IS $C_1$:Clow, Cmid, Chigh |
| 40 | INPUT "TRANSISTOR INPUT CAPACITANCE $C_z$:$1/C_z=1/C_{ce}$ + $1/C_{ce}$", $C_z$ |
| 50 | INPUT "DC BLOCKING CAPACITOR $C_5$", $C_5$ |
| 60 | INPUT "BASE INDUCTANCE + RESONATOR INDUCTANCE L" L |
| 70 | INPUT "FINE TUNE CAPACITANCE $C_2$, $C_2$ |
| 80 | INPUT "LOW END OF TUNING BAND $F_1$", $F_1$ |
| 90 | INPUT "MIDDLE OF TUNING BAND $F_O$", $F_O$ |
| 100 | INPUT "HIGH END OF TUNING BAND $F_2$", $F_2$ |
| 110 | A=$1/C_5+1/C_2+1/C_z$ |
| 120 | Clow = $2*P_1*F_1$ |
| 130 | Clow=Clow$\wedge$2*L-A |
| 140 | Clow=1/Clow |
| 150 | Cmid=$2*P_1+F_0$ |
| 160 | Cmid=Cmid$\wedge$2*L-A |
| 170 | Cmid=1/Cmid |
| 180 | Chigh=$2*P_1*F_2$ |
| 190 | Chigh=Chigh$\wedge$2*L-A |
| 200 | Chigh=1/Chigh |
| 210 | FLOAT 8 |
| 220 | PRINT "L- ";L, "$C_z$", "$C_5$= "; $C_5$, "$C_2$= ";$C_2$ |
| 230 | PRINT "$F_1$= "; $F_1$, "$F_0$= ";$F_0$, "$F_2$= ";$F_2$ |
| 240 | PRINT "Clow= "; Clow, "Cmid=, "Chigh= ";Chigh |
| 250 | END |

When a variable capacitor is operated in parallel with a transmission line above the highest parallel resonant frequency of the combination, a variable capacitance reactance is obtained. Ranges of capacitance reactances from this combination can be much greater than available from the variable capacitor itself. Furthermore, in order to achieve a given range of capacitance reactance, a much larger capacitance variable capacitor is required. Full advantage of this fact is taken by drastically shortening the varactor DC return- Stub A of FIG. 1.

In Table 4 there is shown a copy of the program "SPARLC" which is written for the HP9835.

TABLE 4

```
10    REM PROGRAM "SPARLC"
11    DEG
12    FLOAT 8
20    REM VARIABLE CAPACITOR C₁ IS IN PARALLEL WITH
      STUB Zo
25    REM FIXED CAPACITOR C₂ IS IN SERIES WITH PARALLEL
      C₁/Zo
30    REM Y=j*2*PI*F*C₁-(j/zo)*COT(90*L/D)
40    REM QUARTER WAVELENGTH AT EACH OF 3 FREQUENCIES IS D
50    INPUT "MINIMUM CAPACITANCE C₁", C₁
60    INPUT "CAPACITANCE INCREMENT H",H
70    INPUT "IMPEDANCE OF SHUNT STUB Zo", Zo
80    INPUT "LENGTH OF STUB IN INCHES L",L
90    INPUT "DIELECTRIC CONSTANT Er", Er
100   INPUT "LOWEST FREQUENCY F₁", F₁
110   INPUT "MID FREQUENCY F₂", F₂
120   INPUT "HIGHEST FREQUENCY F₃", F₃
125   INPUT "SERIES FIXED CAPACITOR C₂", C₂
130   G=.25*3E8*39.37*(1/Er^.5)
140   D₁=G/F₁
150   D₂=F/F₂
160   D₃G/F₃
170   PRINT "Zo= ";Zo, "L= "; L, Er= ";Er, "C₂
      = "; C₂
180   PRINT "F₁= "F₁"F₂= ",F₂, "F₃= ";F₃
190   PRINT "C₁", "Z₁", "Z₂", Z₃
200   FOR A=0 TO 10
210   Y₁=2*PI*F₁*C₁-1/Zo*(1/TAN(90*L/D₁))
220   Y₂=2*PI*F₂*C₁-1/Zo*(1/TAN(90*L/D₂))
230   Y₃=2*PI*F₃*C₁-1/Zo*(1/TAN(90*L/D₃))
240   Z₁=1/Y₁-1/(2*PI*F₁*C₂)
250   Z₂=1/Y₂-1/(2*PI*F₂*C₂)
260   Z₃=1/Y₃-1/(2*PI*F₃*C₂)
270   PRINT C₁, Z₁, Z₂, Z₃
280   C₁=C₁+H
290   PRINT LIN(0)
300   NEXT A
310   END
```

TABLE 5

```
10    REM PROGRAM "TWEET"
20    REM COARSE TUNE C1 IS IN PARALLEL WITH FINE TUNE C5
30    REM CAPACITOR C3 IS IN PARALLEL WITH FINE TUNE C4
35    REM DC BLOCK C2 IS IN SERIES WITH C1, L AND C3
40    INPUT "BASE INDUCTANCE + RESONATOR INDUCTANCE L", L
41    INPUT "TRANSISTOR INPUT CAPACITANCE Cz:1/Cz=1/Cbe +
      1/Ccc", Cz
42    INPUT "CAPACITANCE C3", C3
43    INPUT "CAPACITANCE C2", C2
50    INPUT "FINE TUNE CAPACITANCE C4 IS IN PARALLEL WITH
      C3", C4
60    INPUT "COARSE TUNE CAPACITANCE C1", C1
70    INPUT "FINE TUNE CAPACITANCE C5 IS IN PARALLEL WITH
      C1", C5
71    PRINT "L= ";L, "C2= ";C2, "C3= ";C3, "C4= ";C4,"C5= ";
      C5, "Cz= ";Cz
72    PRINT "C1", "F1", "F2", "D"
75    FOR A=0 TO 80
80    F1=(1/C1+1/C3+1/Cz+1/C2)*(1/L)
90    F1=SQR(F1)
100   F1=F1/PI
110   F1=F1/2
120   FLOAT 8
131   Cx=C3+C4
132   Cy=C1+C5
140   F2=1/L*(1/Cx+1/Cy+1/Cz+1/C2)
160   F2=SQR(F2)
170   F2=F2/PI
180   F2=F2/2
200   D=F2-F1
201   PRINT C1,F1,F2,D
231   C1=C1+2.5E-14
232   PRINT LIN(0)
235   NEXT A
240   END
```

Figure 9:
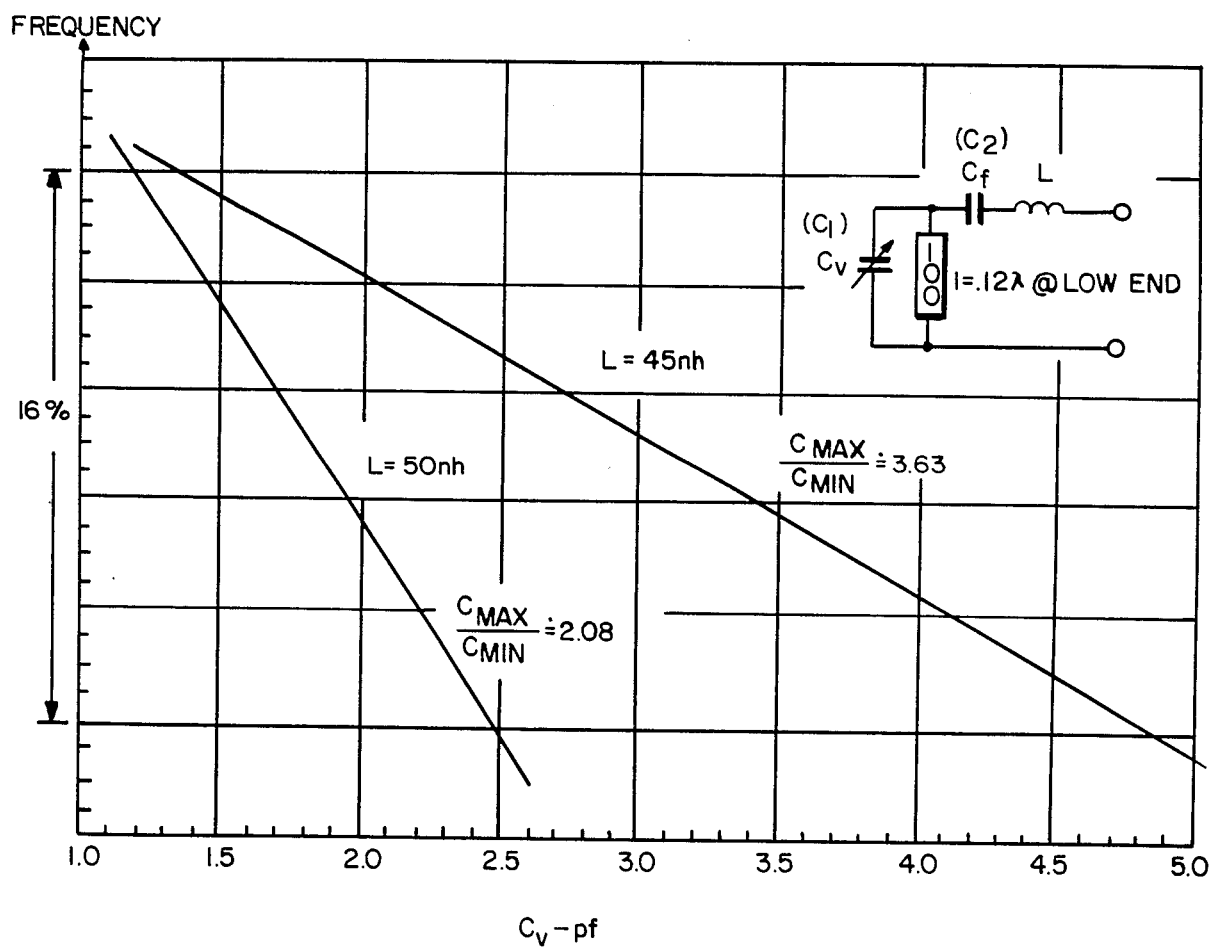

It computes the input impedance at three frequencies for the network of capacitor $C_2$ in series with the parallel combination of $C_1$ and stub $Z_o$, as $C_1$ is varied in increments of H. FIG. 9 shows the range of variable capacitance necessary to tune the exact same frequency band as shown in FIG. 8 with the exact same value of fixed series capacitance $C_f$, using a 100 ohm stub whose length is 0.12 at the low end of the frequency band. The values computed agree closely with those values for which measured data was taken, as shown in FIG. 4 and FIG. 6 for the case of L=45 nh.

Although the invention has been described with reference to a particular embodiment, it will be understood to those skilled in the art that the invention is capable of a variety of alternative embodiments within the spirit and scope of the appended claims.

What is claimed is:

1. A low phase noise two port voltage controlled oscillator apparatus comprising in combination:
    an amplifier means with an input and an output said amplifier means comprising an NPN transistor in which the collector is grounded, the emitter is said output and the base is said input,
    means for coarse tuning the frequency of oscillation of a radio frequency (RF) signal,
    an inductor means operatively connected in series with said coarse tuning means to form a series resonant circuit,
    means for fine tuning said frequency of oscillation of said radio frequency (RF) signal, said fine tuning means operatively connected in series with said series resonant circuit, said fine tuning means including a DC blocking capacitor between it and said resonant circuit, said fine tuning means operatively connected to said input of said amplifier means, said coarse tuning means and said fine tuning means operatively in conjunction to establish said frequency of oscillation said radio frequency (RF) signal which is applied to said input of said amplifier means, said radio frequency (RF) signal appearing at said output of said amplifier means.

2. A voltage controlled oscillator apparatus as described in claim 1 wherein said coarse tuning means comprises in combination:
    a resistor in series with a transmission line,
    a capacitor operatively connected between the junction of said resistor and said transmission line to ground,
    a first capacitance means operatively connected to the other end of said transmission line, said first capacitance means being voltage adjustable, one end of said first capacitance means being connected to ground, and,
    an adjustable tuning stub operatively connected to the other end of said first capacitance means, and,
    said fine tuning means comprising a second capacitance means which is voltage adjustable.

3. A voltage controlled oscillator apparatus as described in claim 2 wherein said first and second capacitance means respectively comprise a silicon varactor.

4. A voltage controlled oscillator apparatus as described in claim 2 wherein said first and second capacitance means are completely reversed-biased over the full RF period.

5. A voltage controlled oscillator apparatus as described in claim 1 wherein said NPN transistor has a low base spreading resistance.

6. A voltage controlled oscillator apparatus as described in claim 2 wherein said first and second capacitance means respectively comprise a large capacitance silicon varactor.

7. A voltage controlled oscillator apparatus as described in claim 2 wherein said first capacitance means comprises a pair of silicon varactors which are connected back to back.

8. A voltage controlled oscillator apparatus as described in claim 2 wherein said adjustable tuning stub is adjusted to have a length that is less than a quarter wavelength.

9. A voltage controlled oscillator apparatus as described in claim 2 further including a third capacitance means which is in parallel with said first capacitance means, said third capacitance means comprising a voltage adjustable capacitor to fine tune said coarse tuning means.

* * * * *